(12) United States Patent
Petsko

(10) Patent No.: US 6,535,066 B1
(45) Date of Patent: Mar. 18, 2003

(54) DYNAMIC RF AMPLIFIER BIAS CONTROL FOR DIGITAL WIRELESS COMMUNICATIONS DEVICES

(75) Inventor: David Petsko, Akron, OH (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 09/886,597

(22) Filed: Jun. 21, 2001

(51) Int. Cl.[7] .............................. H03G 3/10; H03G 3/20
(52) U.S. Cl. ...................... 330/285; 330/136; 330/129; 330/279
(58) Field of Search ................. 330/129, 136, 330/279, 285

(56) References Cited

U.S. PATENT DOCUMENTS

| | | | |
|---|---|---|---|
| 4,298,886 A | * 11/1981 | Perkins | 348/380 |
| 5,015,839 A | * 5/1991 | Tanikoshi | 330/278 |
| 5,025,784 A | * 6/1991 | Shao et al. | 607/5 |
| 5,055,797 A | * 10/1991 | Chater | 330/255 |
| 5,297,424 A | * 3/1994 | Sackett | 116/34 R |
| 6,018,650 A | * 1/2000 | Petsko et al. | 455/234.1 |
| 6,043,707 A | * 3/2000 | Budnik | 330/10 |
| 6,148,220 A | 11/2000 | Sharp et al. | |
| 6,157,253 A | 12/2000 | Sigmon et al. | |

* cited by examiner

*Primary Examiner*—Robert Pascal
*Assistant Examiner*—Patricia Nguyen
(74) *Attorney, Agent, or Firm*—Arter & Hadden LLP

(57) ABSTRACT

An adaptive bias control scheme for an Orthogonal Frequency Division Multiplex ("OFDM") transmitter. The transmitter chain is comprised of class A amplifiers. The amplifiers in the transmit chain are backed off from P1dB to ensure linear amplification of the signal. Amplifier back off is defined as (Amplifier P1dB) minus (Average Signal Power). Since the efficiency of the amplifier decreases in direct proportion, to the back off, it is desirable to minimize back off while maintaining linearity. The back off is dependent on the peak to average power ratio ("PAPR") of the OFDM waveform. The PAPR is measured on a symbol by symbol basis and the amplifier P1dB is adjusted in proportion to the PAPR of the symbol, maintaining a P1dB sufficient to provide the required back off dictated by the maximum PAPR of the OFDM waveform, but can be lowered for symbols with PAPR below the maximum. The average operating point of the amplifiers is reduced by the adaptive bias control on a symbol-by-symbol basis.

21 Claims, 4 Drawing Sheets

DYNAMIC RF AMPLIFIER BIAS CONTROL FOR DIGITAL WIRELESS COMMUNICATIONS DEVICES

BACKGROUND OF THE INVENTION (1) Field of the Invention

The present invention relates in general to wireless communications systems and more specifically to a method and apparatus for reducing the power consumption of an RF amplifier during transmission periods without significantly reducing any performance goals for the communications systems.

(2) Description of the Related Art

Digital communications devices including digital voice, for example digital cellular phones, and digital data such as computer networking transmit RF energy to communicate. These devices often require highly linear RF power amplifiers to operate properly. In general, linear power amplifiers consume much more power to operate compared to non-linear power amplifiers and are much less efficient.

Normally, the linear amplifiers used in these applications are Class A amplifiers. Class A amplifiers have a theoretical efficiency of fifty percent, however, a Class A amplifier used as a power amplifier typically operates at ten to twenty percent efficiency in order to maintain third-order inter-modulation distortion down to required levels for most communications applications.

Traditionally, non-linear amplifiers are used to save power. However, the need for using linear power amplifiers has grown tremendously in the recent years as a result of the growth in digital communications technologies. Linear amplifiers are needed when a clean signal with minimal distortion is desired. Many small, hand-held digital electronic communication devices are battery powered, having limited power storage capacities. Therefore, it is desirable to increase the transmitter power efficiency, especially when linear RF power amplification is a requirement.

Traditionally, analog techniques were used as a means to develop control circuits that help reduce Class A amplifier power consumption. Usually, the voltage or power waveform entering or leaving the power amplifier is sampled and a control voltage waveform (error signal) is produced. The control waveform is then used to modulate (raise or lower) the DC supply output voltage of the power amplifier as needed. In effect, the supply voltage is varied in proportion to amplitude of the signal being amplified and DC supply voltage excess is reduced. When the DC supply excess is reduced, the amplifier average power consumption is also reduced.

There are several drawbacks to the traditional power saving methods. First, analog feedback and feed-forward control systems are difficult to manufacture in high yields and are therefore not cost effective in high volume production. Second, modulation of the DC supply voltage is complicated, circuit wise, and does not lend itself to easy implementation. Further, modulated power supplies are generally switching power supplies that are bulky (inductive component) and require additional low pass filtering to remove the unwanted switching frequency signals. Low pass filtering also places an upper limit on the modulation (signal) speed and response time for which the technique can operate. Third, the accuracy of the amplifier voltage signal or power signal measurement technique may vary with temperature or have limited dynamic range. And finally, DC power supply and RF amplifiers are normally highly integrated circuit 'blocks' that are developed independently which makes the adaptation of one 'block' to the other 'block' difficult to achieve for high yield and volume production applications. Therefore, a need exists for a less complicated alternative method to reduce the power consumption of Class A, RF power amplifiers that is more suited for high volume, high yielding commercial applications.

It is an object of the present invention to reduce the average power consumption of a highly linear RF power amplifier during transmission periods without significantly degrading the RF system performance objectives.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

SUMMARY OF THE INVENTION

The invention describes a method and an apparatus that makes use of digital signal processing techniques to analyze digital (modulation) data as discrete sequences or discrete samples (sets) and then to set an optimum RF amplifier bias setting for each sequence that is determined either by utilizing an appropriate algorithm (computation) or by selection of a predefined bias setting (look-up table). The time interval for each discrete RF amplifier bias setting is chosen to correspond directly or indirectly with an associated (modulated) digital data sample set time interval.

The apparatus operates by dividing or fragmenting long sequences (quasi-continuous) of (modulation) data waveform (n-bit) samples into discrete blocks of short sequence data waveform (n-bit) samples. Each discrete block of (n-bit) samples has an associated magnitude characteristic (statistical quantity) that can be independent of the magnitude characteristic for the entire 'long' sequence. For example, the peak magnitude of the 'long' sequence may be much greater than the peak magnitude of a given short sequence fragment. The apparatus operates by saving or buffering the maximum magnitude characteristic of each short sequence for a predetermined length of time (delay). The continuous magnitude sampling within each short sequence is sequential, therefore, the buffered magnitude data is regularly updated (data clock) until the end of the short interval is reached.

The magnitude buffering operation during each short sequence creates a control delay time interval equal to the short sequence time interval (minimum). Therefore, the data waveform (n-bit) samples must also be delayed for a short sequence time interval to maintain synchronous behavior (delays) between the digital control processing and digital data processing paths. The digital data processing delay is implemented with a mux-demux, (parallel) data-buffering scheme that creates a single short sequence time delay function.

Once the buffered data and control (data magnitude) operations for a single short time interval (sample sequence) is completed, the data segment is forwarded on directly for upconversion, amplification, and filtering (transmitter). The control (data magnitude) information is used to either compute (algorithm) or map (look-up table) a control signal via an Analog-to-Digital Converter to the bias network of the RF amplifier in order to vary the bias. Furthermore, the lookup table or algorithm may also consider other related factors such as the modulation encoding, ambient temperature, or transmit signal quality desired The method of the present invention comprises the steps of detecting the peak of each symbol, selecting an appropriate bias point, and then adjusting the bias to the appropriate bias point.

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

DESCRIPTION OF DRAWINGS

The drawings illustrate the best mode presently contemplated of carrying out the invention.

This the drawings.

DETAILED DESCRIPTION OF THE INVENTION

The present invention contemplates an adaptive bias control scheme for an Orthogonal Frequency Division Multiplex ("OFDM") transmitter. The transmitter chain is typically comprised of class-A amplifiers. The amplifiers in the transmit chain are backed off from P1db to ensure linear amplification of the signal. Back off is defined as the average signal power subtracted from amplifier P1db. Since the efficiency of the amplifier decreases in direct proportion to the back off, it is desirable to minimize the back off while at the same time maintaining linearity.

In the present invention, the back off is dependent on the peak to average power ration ("PAPR") of the OFDM waveform. The PAPR should be measured and calculated on a symbol-by-symbol basis. The amplifier's P1db be adjusted in proportion to the PAPR of the symbol, maintaining a P1db sufficient to provide the required back off. Thus, the amplifiers are not required to operate at a back off dictated by the maximum PAPR of the OFDM waveform, but can be lowered for symbols with PAPR below the maximum. The average operating point of the amplifier is reduced by the adaptive bias control on a symbol-by-symbol basis.

The amount of back off depends on the level of distortion to the transmitted signal that the system can tolerate. As an example, wireless LAN systems operate at several transmission data rates. These data rates correspond to different modulations of the OFDM subcarriers. The data rates and modulation methods can except various levels of signal distortion, for example 54 Mbps operation requires EVM<−25 db, 36 Mbps operation requires EVM<−19 db. The system of the present invention can be calibrated to reduce the back off requirement in proportion to the data rate.

Feedback such as signal quality can be factored into the lookup table or algorithm facilitating an adaptive response to the channel and the receiver's ability to decode the signal. The feedback may be in the form of excessive requests to resend data. Before terminating the transmission, the amplifier chain can attempt to improve signal quality by increasing the back off. The type of adaptive control of the signal distortion would be difficult if not impossible to accomplish using analog envelope detection and control of the transmitter bias.

Figure 1:
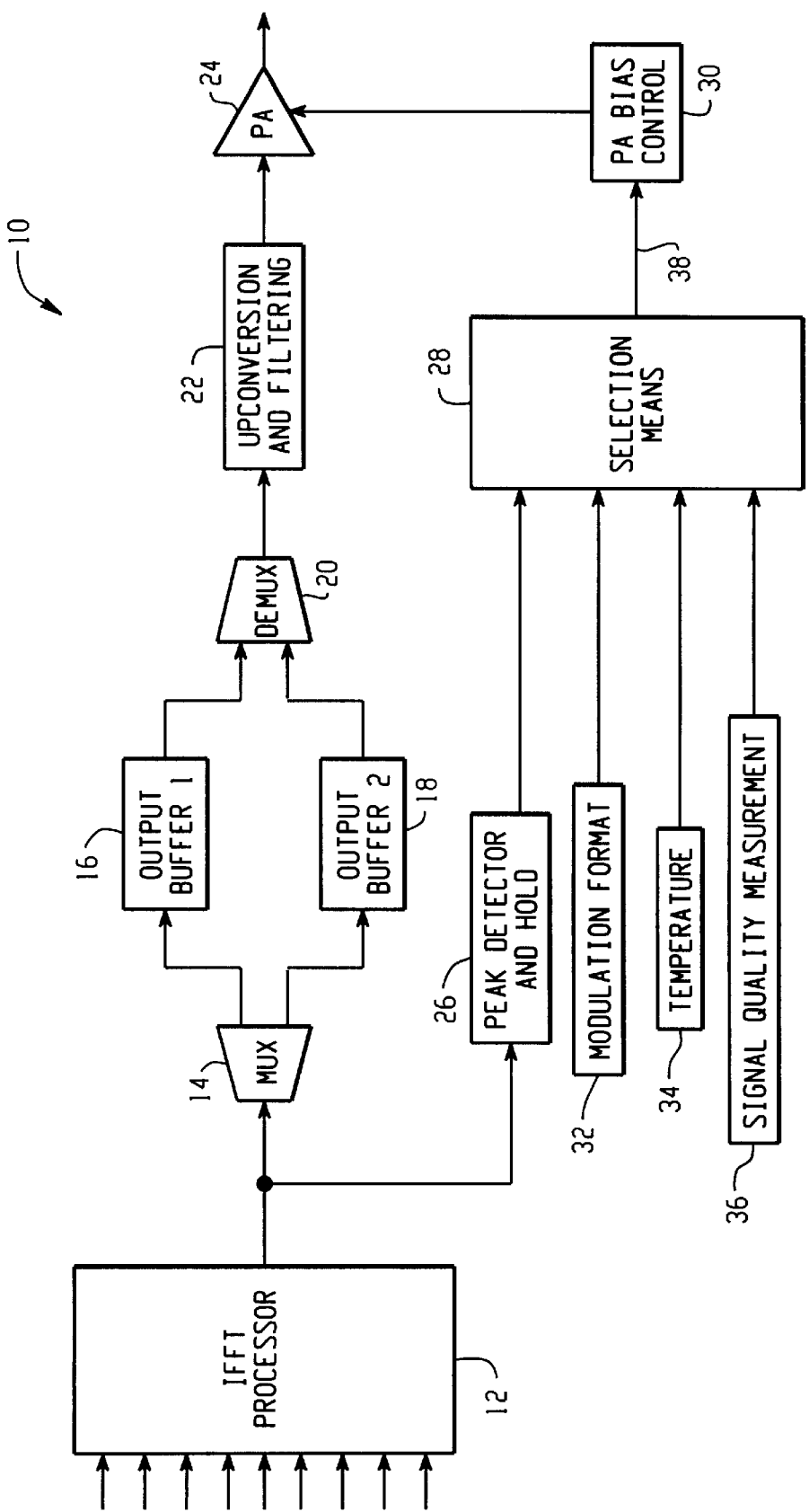
FIG. 1 is a detailed electrical block diagram of the dynamic amplifier bias control in accordance with the present invention.

Referring now to FIG. 1, an amplifier with dynamic bias control incorporating the features of the present invention is generally designated 10. An IFFT processor 12 receives a plurality of inputs and generates a waveform, an OFDM symbol. The typical IFFT processor may receive up to 48 inputs simultaneously. The symbol is then sent to a multiplexer 14.

Because there is a latency in computing the proper bias, the waveform is buffered to insure the bias is properly set when the waveform reaches the amplifier. Typically, there is a one symbol delay. FIG. 1 shows two output buffers, output buffer 1, 16, and output buffer 2, 18. Each output buffer is comprised of a shift register. A multiplexer 14 and demultiplexer 16 alternate between output buffers. As one buffer is being emptied through the demultiplexer 20, the other buffer receives the next symbol via the multiplexer 14 from the IFFT processor 12. As the contents of the selected output buffer are being shifted through the demultiplexer 20, the symbol is then upconverted and filtered utilizing standard techniques well known in the art as shown in block 22 prior to being sent to power amplifier 24.

As the symbol is being sent from the IFFT processor 12 to the multiplexer 14, a peak detector and hold 26 measures the peak of the symbol. The value of the peak of the symbol is then forwarded to selection means 28.

The selection means 28 in the preferred embodiment would be comprised of a lookup table, map or other equivalent means. This would be the simplest method and is easily implemented when the only variable is the value of the symbol's peak. However, in some situations it may be desirable to consider other factors. The modulation format 32 may be input into the selection means, as well as the amplifier's temperature 34 or a signal quality measurement 36. Signal quality may be determined by detecting excessive requests to resend data. The selection means may be comprised of a microprocessor when several inputs are considered in selecting the bias point. The microprocessor may utilize several look up tables dependent upon any of the many input variables or utilize an algorithm to compute the most efficient bias point.

The selection means then generates a control signal 38. The control signal 38 may be buffered or delayed so that it is not received by the power amplifier bias control 30 until the multiplexer 20 switches output buffers to the correct symbol.

If the selection means 28 is comprised of a lookup table or map, the power amplifier bias control 30 may be unnecessary as the lookup table can return an analog value for the amplifier bias which may be sent directly to the amplifier. However, if a microprocessor or digital means is used to compute the proper bias, a digital to analog converter would be required. In this case, a digital to analog converter can be the power amplifier bias control 30.

Figure 2:
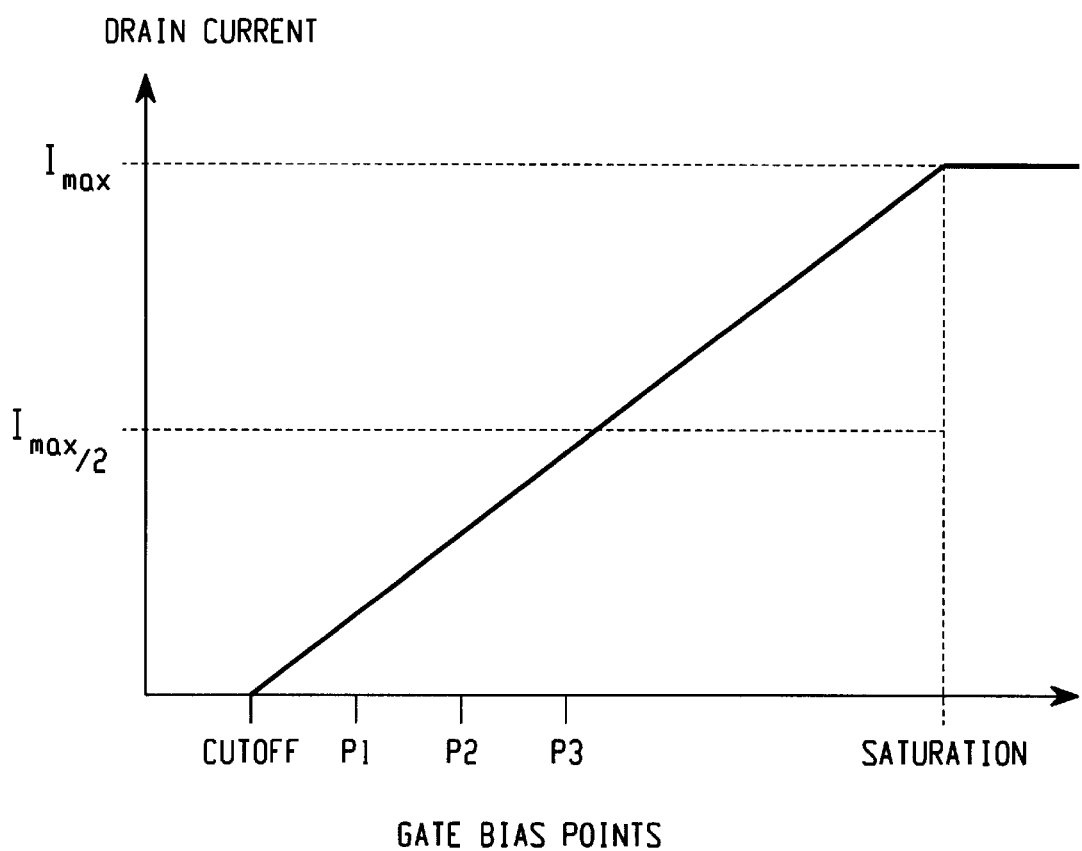
FIG. 2 is a graph depicting an example mapping between gate bias points and drain current.

Referring to FIG. 2, a plot of Drain Current vs. Gate Bias points for an ideal linear amplifier. For linear operation, the drain current 50 must be between zero and Imax. Because power is proportional to the square of the drain current 50, it is desirable to minimize this current. Ideally, the bias point would be set at P1. However, if a peak is detected in a symbol which when superimposed on the bias point at P1 would drive the amplifier into cutoff, the bias control can then move the bias point to P2. In the case where a very large peak is detected, the bias can be set to P3. Ideally, the amplifier is operating at P1.

For optimal operation, the IFFT processor 12 multiplexer 14, demultiplexer 20, peak detector and hold 26 and selection means 28 should be synchronized. Additionally, each symbol should be padded with null values to create a guard interval to give the selection means time to calculate and set the bias in between symbols. When the demultiplexer 20 is ready to switch buffers, selection means 28 should read the value of the peak detector and hold 26, reset the peak detector and hold 26, and send the control signal 38. Furthermore, prior to demultiplexer 20 switching, the output buffer should also be reset. Demultiplexer 20 and multiplexer 14 should then switch at the same time. Since each symbol will need to be padded to compensate for latency, the storage capacity of output buffers 16, 18 should be longer than the symbol.

Figure 3:
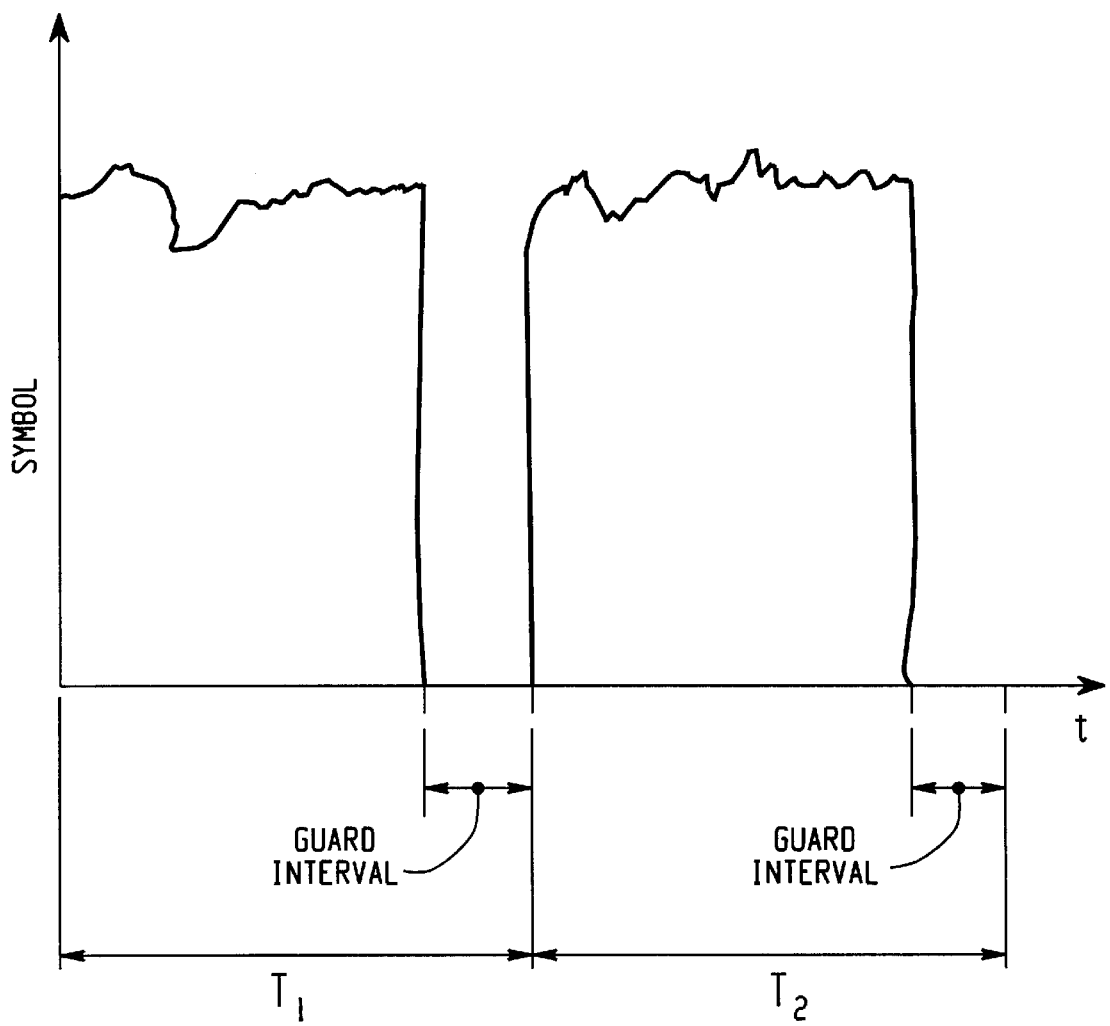
FIG. 3 is a time based graphical example depicting a typical timing sequence contemplated by the present invention.

FIG. 3 shows a typical timing sequence contemplated by the present invention. At the beginning of period T1, the multiplexer 14 would be routing the output from the IFFT processor 12 to output buffer while the peak detector and hold 26 monitors the waveform and retains the peak value of the waveform.

When the guard interval at the end of T1 occurs, the IFFT processor 12 stops transmitting the symbol. Output buffer 1, 16 is then padded with null values. At the same time, the selection means obtains the peak magnitude of the symbol from the peak and hold detector 26 and the peak and hold detector 26 is then reset. The selection means then selects the appropriate bias and the amplifier's bias is adjusted before the beginning of T2. The amplifier is adjusted during the guard interval to prevent distortion. Generally, a guard interval of 20% is recommended, however, this period is dependent upon the time interval needed to adjust the bias for the next symbol.

When period T2 begins, the symbol stored in output buffer 1, 16, is routed to the power amplifier 24 by demultiplexer 20. Mutliplexer 14 directs the output from the IFFT processor 12 to output buffer 2, 18. When the guard interval period in T2 is reached, the apparatus responds similar to when the guard interval period in T1 was reached. That is the symbol being stored in output buffer 2, 18 is padded with null values while the selection means 28 reads the peak value from the peak detector and hold 26. The selection means 28 then generates a control signal 38 which causes the bias of the power amplifier 24 to be adjusted.

Figure 4:
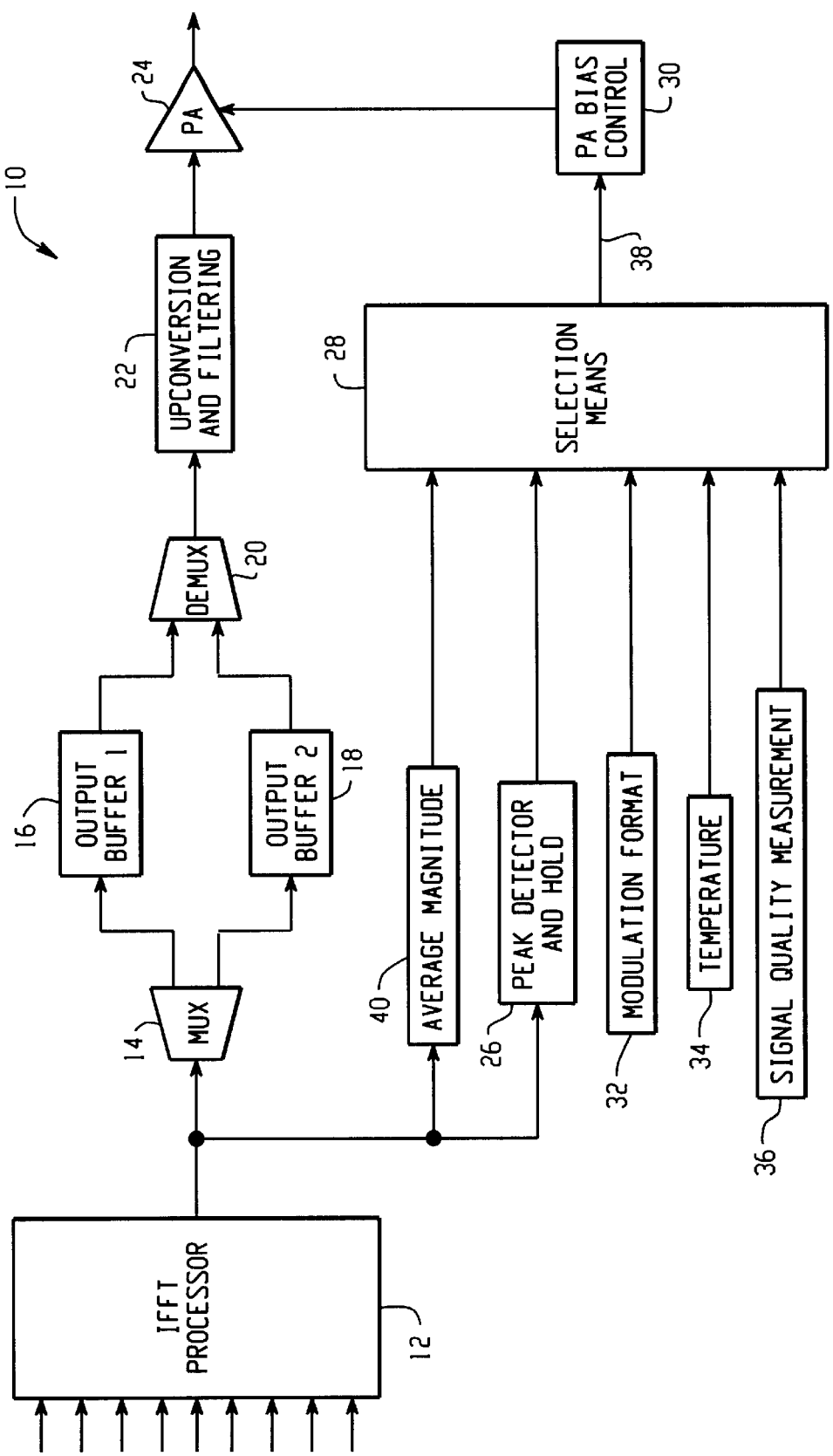
FIG. 4 is a detailed electrical block diagram of an alternative embodiment of the dynamic amplifier bias control in accordance with the present invention.

FIG. 4 illustrates an alternative embodiment of the present invention. The apparatus in FIG. 4 also has means for measuring the average magnitude 40 of the symbol. Typically the average power, hence average magnitude, of the symbol is constant. Therefore, only the peak magnitude of the symbol is needed to calculate the PAPR of the symbol. However, in the case where the symbol's average power fluctuates, the PAPR may be computed by comparing the peak detector and hold 26 value with the value stored in the average magnitude 28. In this embodiment, because the average magnitude 40 must be calculated, the length of the guard interval may need to be increased.

Although the invention has been shown and described with respect to a certain preferred embodiment, it is obvious that equivalent alterations and modifications will occur to others skilled in the art upon the reading and understanding of this specification. The present invention includes all such equivalent alterations and modifications and is limited only by the scope of the following claims.

What is claimed is:

1. An apparatus for dynamically adjusting the bias of an amplifier, comprising:
    (a) an inverse Fourier transform processor receiving a plurality of inputs;
    (b) a multiplexer, the input connected to the output of the inverse Fourier transform processor;
    (c) a plurality of buffers connected to the output of the multiplexer;
    (d) a demultiplexer receiving inputs from the plurality of output buffers, the output of the demultiplexer connected by a circuit to the input of the amplifier;
    (e) a peak detector and hold circuit, the input of the circuit connected to the output of the inverse Fourier transform processor;
    (f) a selection means, the selection means receiving an input from the peak detector and hold circuit, and responsive to the input selecting a bias point for the amplifier, the selection means output connected to a bias control circuit, the bias control circuit controlling the amplifier's bias point.

2. The apparatus of claim 1, the circuit connecting the output of the demultiplexer to the input of the amplifier further comprises an intermediate circuit.

3. The apparatus of claim 1, the circuit connecting the output of the demultiplexer to the input of the amplifier further comprises a filter circuit.

4. The apparatus of claim 1, the selection means further comprising inputs for modulation format, temperature, and signal quality measurement.

5. The apparatus of claim 4, wherein the selection means comprises a microprocessor based controller.

6. The apparatus of claim 5, wherein the microprocessor based controller further comprises computer readable instructions stored on a computer readable medium, the computer readable instructions comprising:
    (a) instructions for receiving an input;
    (b) instructions for calculating an optimal bias point responsive to the instructions for receiving an input;
    (c) instructions for outputting the bias point.

7. A method for dynamically adjusting the bias of an amplifier, the steps comprising:
    dividing a long sequence of waveforms into a plurality of short waveform samples, wherein each of the plurality of short waveform samples having a maximum magnitude;
    for each of the plurality of short waveform samples:
        calculating a bias point for the amplifier based on the maximum magnitude setting the bias point of the amplifier; and
        forwarding the short waveform sample to the amplifier after setting the bias point.

8. The method for dynamically adjusting the bias of an amplifier as in claim 7 wherein for each of the plurality of waveform samples further comprises buffering the maximum magnitude.

9. The method for dynamically adjusting the bias of an amplifier as in claim 7 wherein for each of the plurality of waveform samples further comprises padding each of the plurality of the short waveform samples with a NULL.

10. The method for dynamically adjusting the bias of an amplifier as in claim 9 wherein the padding step creates a guard interval between each of the plurality of waveform samples.

11. The method for dynamically adjusting the bias of an amplifier as in claim 8 wherein the forwarding step further comprises synchronizing the forwarding and setting steps wherein the setting step is completed before the forwarding step begins.

12. A computer readable medium of instructions, comprising:

means for dividing a long sequence of waveforms into a plurality of short waveform samples, wherein each of the plurality of short waveform samples having a maximum magnitude;

means for calculating a bias point for the amplifier based on the maximum magnitude for each of the plurality of short waveform samples;

means for setting the bias point of the RF amplifier for each of the plurality of short waveform samples; and means for forwarding the short waveform sample to the amplifier for each of the plurality of short waveform samples after the means for setting the bias point has set the bias point.

13. The computer readable medium of instructions as in claim 12 further comprising means for buffering the maximum magnitude for each of the plurality of waveform samples.

14. The computer readable medium of instructions as in claim 12 further comprising means for padding each of the plurality of the short waveform samples with a NULL.

15. The computer readable medium of instructions as in claim 12 further comprising means for creating a guard interval between each of the plurality of waveform samples.

16. The computer readable medium of instructions as in claim 12 wherein the forwarding step further comprises synchronizing the forwarding and setting steps wherein the setting step is completed before the forwarding step.

17. An apparatus for dynamically adjusting the bias of an amplifier, comprising:

means for dividing a long sequence of waveforms into a plurality of short waveform samples, wherein each of the plurality of short waveform samples having a maximum magnitude;

means for calculating a bias point for the amplifier based on the maximum magnitude for each of the plurality of short waveform samples;

means for setting the bias point of the amplifier for each of the plurality of short waveform samples; and means for forwarding the short waveform sample to the amplifier for each of the plurality of short waveform samples;

wherein the means for forwarding the short waveform sample waits until the means for setting the bias point has set the bias point.

18. The apparatus for dynamically adjusting the bias of an amplifier as in claim 17 further comprising means for buffering the maximum magnitude for each of the plurality of waveform samples.

19. The apparatus for dynamically adjusting the bias of an amplifier as in claim 17 further comprising means for padding each of the plurality of the short waveform samples with a NULL.

20. The apparatus for dynamically adjusting the bias of an amplifier as in claim 17 further comprising means for creating a guard interval between each of the plurality of waveform samples.

21. The apparatus for dynamically adjusting the bias of an amplifier as in claim 17 wherein the forwarding step further comprises synchronizing the forwarding and setting steps wherein the setting step is completed before the forwarding step.

* * * * *